(12) United States Patent
Van Duuren (10) Patent No.: US 7,746,715 B2
(45) Date of Patent: Jun. 29, 2010

(54) ERASE AND READ SCHEMES FOR CHARGE TRAPPING NON-VOLATILE MEMORIES

(75) Inventor: Michiel Jos Van Duuren, Heverlee (BE)

(73) Assignee: NXP B.V., Eindhoven (NL)

( * ) Notice: Subject to any disclaimer, the term of this patent is extended or adjusted under 35 U.S.C. 154(b) by 101 days.

(21) Appl. No.: 10/567,070

(22) PCT Filed: Aug. 4, 2004

(86) PCT No.: PCT/IB2004/051382

§ 371 (c)(1),
(2), (4) Date: Feb. 3, 2006

(87) PCT Pub. No.: WO2005/017911

PCT Pub. Date: Feb. 24, 2005

(65) Prior Publication Data

US 2006/0250855 A1    Nov. 9, 2006

(30) Foreign Application Priority Data

Aug. 13, 2003  (EP)  ................... 03102529

(51) Int. Cl.
*G11C 7/02* (2006.01)
(52) U.S. Cl. .................. 365/210.1; 365/185.11; 365/230.03
(58) Field of Classification Search .............. 365/210, 365/210.1, 185.21, 185.33, 189.07, 185.11, 365/230.03, 185.29
See application file for complete search history.

(56) References Cited

U.S. PATENT DOCUMENTS

| | | | | |
|---|---|---|---|---|
| 3,501,099 A | * | 3/1970 | Benson | ................... 239/584 |
| 4,247,918 A | * | 1/1981 | Iwahashi et al. | ....... 365/185.23 |
| 4,266,727 A | * | 5/1981 | Happel et al. | ............... 239/409 |
| 4,381,077 A | * | 4/1983 | Tsumura et al. | ............... 239/89 |
| 6,233,178 B1 | * | 5/2001 | Krishnamurthy et al. | ..................... 365/185.33 |
| 6,257,499 B1 | * | 7/2001 | Sturman | ...................... 239/96 |
| 6,331,951 B1 | | 12/2001 | Bautista et al. | |
| 6,366,497 B1 | * | 4/2002 | Guliani et al. | ......... 365/185.21 |
| 6,442,074 B1 | | 8/2002 | Hamilton | |
| 6,608,778 B1 | | 8/2003 | Liu et al. | |
| 6,639,849 B2 | * | 10/2003 | Takahashi et al. | ....... 365/185.03 |
| 6,778,443 B2 | * | 8/2004 | Shiga et al. | ............ 365/185.33 |
| 6,791,880 B1 | * | 9/2004 | Kurihara et al. | ......... 365/185.21 |
| 7,009,890 B2 | * | 3/2006 | Yamazoe et al. | ....... 365/189.01 |
| 7,092,297 B1 | * | 8/2006 | Torii | ..................... 365/185.29 |
| 2001/0007541 A1 | * | 7/2001 | Hirakawa | .................... 365/233 |
| 2003/0218913 A1 | | 11/2003 | Le et al. | |

* cited by examiner

*Primary Examiner*—Hoai V Ho
*Assistant Examiner*—Jason Lappas (57) ABSTRACT

The present invention describes a method for operating an array of nonvolatile charge trapping memory devices. The method comprises before a block erase step (52) of substantially all of the non-volatile memory devices of the array, block programming (51) of substantially all of the non-volatile memory devices of the array. It is an advantage of the present invention that, by doing this, a further charge trapping nonvolatile memory device may be used as a reference cell, which is programmed and erased with the block-programming and block-erasing of the memory cells in the array, so that the reference cell shows the same cycling history as the memory cells in the array. This feature can be used for adapting read parameters to ageing of the memory cells. Corresponding devices are also provided.

21 Claims, 9 Drawing Sheets

ERASE AND READ SCHEMES FOR CHARGE TRAPPING NON-VOLATILE MEMORIES

The present invention relates to non-volatile semiconductor memories, more particularly to non-volatile memories based on charge trapping layers, and devices comprising such memories, and methods of operating same so as to obtain improved data retention and limited erase induced degradation.

Non-volatile memories (NVMs) are used in a wide variety of commercial and military electronic devices and equipment, such as e.g. hand-held telephones, radios and digital cameras.

Non-volatile memories based on charge trapping, for example in a charge trapping layer (for instance a silicon nitride layer sandwiched between two oxide layers) or in nano-crystals, instead of a floating gate (FG) are being investigated more and more, since they have considerable potential to be used in future CMOS generations (the 90 nm node and beyond). The main difference between charge trapping devices and floating gate devices is that in charge trapping devices, electrons are trapped in energy minima caused by imperfections in the charge trapping layer, e.g. nitride layer, or, in the case of nano-crystal memories, on the nano-crystals in a gate oxide. In FG devices, on the other hand, charges are trapped in a FG layer where they cannot get out because the FG layer is surrounded by dielectric layers. In a FG device, lateral charge transport is possible inside the FG layer, which is not the case in a charge trapping device: there the charge is trapped at a substantially fixed location inside the charge trapping layer.

The main reason for this revived interest in charge trapping devices is the good scaling perspective that charge trapping devices comprising a dielectric charge trapping layer offer, eliminating for instance FG patterning issues (such as lithography, overlay and topography). Moreover, they can be programmed and erased with lower voltages than FG devices, which is a very important point, especially in embedded memories, as the market continues to demand devices with a lower voltage and a lower power consumption. A third advantage is the excellent program/erase endurance, which is about two orders of magnitude better than what can be reached with FG devices, endurance being defined as: "the measure of the ability of a NVM device to meet its data sheet specifications as a function of accumulated non-volatile data changes".

The major disadvantage of charge trapping devices is their limited data retention, which is a result of the (necessarily) thin dielectric between the substrate and the charge trapping layer. Data retention is the ability of a NVM to retain data. Moreover, a too long (or repeated) erasure process can lead to erase induced degradation.

U.S. Pat. No. 6,233,178 relates to flash memory devices, more particularly to flash memory devices where the erase or bulk operation is performed in such a way as to increase the charge stored in the device. The patent describes a pre-conditioning method and apparatus for mitigating erase-induces stress within such flash memory devices. The pre-conditioning method disclosed includes exposing the memory cells to a block discharge (program) operation immediately prior to a block charge (erase) operation, in order to mitigate voltage bias build-up between a floating gate and a control gate of the flash memory cell, thus reducing undesired stresses resulting therefrom.

It has been observed by the inventor of the present invention that, for charge trapping memory devices, for example for charge trapping devices having a dielectric charge trapping layer, it is not, contrary to what U.S. Pat. No. 6,233,178 discloses, the fact that a device already charged with electrons is charged one more time which causes problems. In other words: it is not charging an already charged memory cell that causes problems. Instead, discharging an already discharged memory cell deteriorates the cell.

It is an object of the present invention to provide methods and device constructions which alleviate deterioration of charge trapping memory devices. These charge trapping memory devices may comprise charge trapping devices having a dielectric charge trapping layer, or nano-crystal memories.

The above objective is accomplished by a method and device according to the present invention.

The present invention provides a method for operating an array of non-volatile charge trapping memory devices, the method comprising before a block erase step of substantially all of the non-volatile memory devices of the array, block programming of substantially all of the non-volatile memory devices of the array. With "substantially all" is meant at least half of the non-volatile memory devices, e.g. every second device in the array, preferably more, up to all non-volatile memory devices of the array.

A method according to the present invention may furthermore comprise after the block erase operation, programming some of the non-volatile memory devices of the array, for storing a useful data content in some of the non-volatile memory devices of the array. Which ones of the non-volatile memory devices are programmed, depends on data content to be stored in the non-volatile memory devices of the array.

A programming operation may comprise performing a charging operation, and an erase operation may comprise performing a discharging operation.

A method according to the present invention may furthermore comprise reading the data content stored in a non-volatile memory device of the array. For reading the data content stored in a non-volatile memory device of the array, at least one further charge trapping non-volatile memory device may be used as reference cell which is programmed and erased for the block-programming and block-erasing of the non-volatile memory devices in the array. Preferably, the programming and erasing of the reference cell is carried out substantially at the same time as, i.e. with or immediately before or after, the block-programming and block-erasing of the non-volatile memory devices in the array. In another embodiment, there is a first time period between the programming and erasing of the reference cell and the block-programming and block-erasing of the non-volatile memory devices in the array and there is a second time period between writing useful data content to the array and reading the data content, the first time period being shorter than the second time period. When the array is block programmed and block erased several times, it is preferred if the number of times the reference cell is programmed and erased being the same as the number of times the non-volatile memory devices are block-programmed and block-erased. The use comprises measuring an electrical parameter, such as current or voltage, relating to ageing. In using a reference cell, a read current from the reference cell may be compared with a read current from the non-volatile memory device in the array. This can be a bit line current for example. Alternatively, a control gate voltage of the reference cell may be adapted to the ageing of the non-volatile memory devices in the array. The reference cell is then used as a CG voltage reference, and not as a drain current reference. According to still an alternative embodiment, the reference cell may be a reference for another measurable quantity, such as bit line voltage for example. A combination of any of the above is also possible. It is to be noted that a reference cell is preferably only programmed during a preconditioning step before an erase step. This means that when programming useful data content into the memory cells in the array, the reference cell does not need to be programmed, and preferably is not. This has the advantage that the reference cell remains having a relatively low threshold voltage, thus conveniently allowing for generation of an electrical reference signal.

In a method according to the present invention, the memory devices of the array together may function as reference cells. This may be obtained by using a so-called DC-free coding. This is a coding scheme in which the number of stored '1's is equal to the number of stored '0's. Reading the data content stored in the array may then comprise adjusting a setting point of sense amplifiers so as to obtain the same number of first values as second values in the array.

It is an advantage of the present invention that a reference device or a plurality of reference devices can be programmed and erased with the cells in the array, so that all cells in the array have the same cycling history as the reference cell(s), and are thus degraded in the same way.

In all the embodiments of the present invention, the non-volatile memory devices may be charge trapping devices having a dielectric charge trapping layer, such as SONOS devices for example. Alternatively, the non-volatile memory devices may be nano-crystal memory devices.

The present invention also provides an array of non-volatile charge trapping memory devices, the array comprising:
    means for block programming of all or substantially all of the non-volatile memory devices of the array,
    means for block erasing of all or substantially all of the programmed non-volatile memory devices, and
    control means for controlling the array of non-volatile memory devices such that before block erasing all or substantially all of the nonvolatile memory devices of the array, all or substantially all of the non-volatile memory devices of the array are block programmed.

The present invention also provides an array of non-volatile charge trapping memory devices, the array being arranged to execute any of the methods according to the present invention.

The array of non-volatile memory devices may form a non-volatile memory.

The present invention furthermore provides an electrical device, such as e.g. a mobile telephone or any other electrical device incorporating memory elements, comprising an array of non-volatile charge trapping memory devices, the array comprising:
    means for block programming of all or substantially all of the non-volatile memory devices of the array,
    means for block erasing of all or substantially all of the programmed non-volatile memory devices of the array, and
    control means for controlling the array of non-volatile memory devices such that before block erasing of substantially all of the non-volatile memory devices of the array, all or substantially all of the non-volatile memory devices of the array are block programmed.

In an electrical device according to the present invention, the non-volatile charge trapping memory device may comprise a transistor having a channel and a control gate, in which case a dielectric charge trapping layer may be located between the channel and the control gate. The present invention is not limited to transistor devices, however. For example, a gated diode with a dielectric charge trapping layer can be used as non-volatile charge trapping memory device. A gated diode is a lateral p-n junction with a gate on top thereof, the dielectric charge trapping layer according to the present invention being in between the p-n junction and the gate. If the junction is reversibly biased (e.g. n-type region positive with respect to p-type bulk material), the breakdown voltage of the junction depends on the gate bias because the gate bias determines the surface potential (the more negative the gate is biased, the earlier the junction breaks down). A charge trapped in the charge trapping dielectric layer influences the vertical electrical field between the junction and the gate, and thus the magnitude of the current through the p-n junction can be used to determine the amount of charge trapped.

In an electrical device according to the present invention, the array may be provided with at least one non-volatile memory device for use as a reference cell in a sense amplifier. The array may comprise means for programming and erasing the reference cell for a block-programming or block-erase of the non-volatile memory devices. The programming and erasing of the reference cell is preferably done substantially at the same time as, i.e. with or shortly before or after, the block-programming and block-erase of the non-volatile memory devices in the array.

The at least one reference cell may be separate from the array, or may be inside the array. The memory devices of the array together may function as reference cells. An electrical device according to the present invention may comprise means for comparing a read current from the reference cell with a read current from a non-volatile memory device in the array.

An electrical device according to the present invention may comprise means for adapting a read current for reading the non-volatile memory devices in the array to the ageing of the reference cell and thus to the ageing of all cells in the array. An electrical device according to the present invention may also comprise means for adapting a required control gate voltage for reading, depending on the ageing of the reference cell and thus on the ageing of the non-volatile memory devices in the array.

In an electrical device according to the present invention, the non-volatile memory devices may e.g. be charge trapping devices having a dielectric charge trapping layer, such as SONOS devices for example, or e.g. nano-crystal charge trapping memory devices.

In an electrical device according to the present invention, the array of non-volatile memory devices may form a non-volatile memory.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 1 is a schematic drawing of a conventional charge trapping memory cell having a dielectric charge trapping layer, in this case a SONOS cell. FIG. 1a) illustrates the programming condition; FIG. 1b) illustrates the erasing condition and FIG. 1c) illustrates the self-limiting erase mechanism. The indicated voltage values are just examples.

In FIGS. 3a and 3b the upper curves refer to $V_T$ of the cells programmed with +12V for 10 ms. In FIG. 3a the lower curve refers to $V_T$ of the cells erased with −12V for 100 ms. In FIG. 3b the lower curve refers to $V_T$ of the cells erased with −9V for 50 ms.

In the different figures, the same reference figures refer to the same or analogous elements.

The present invention will be described with respect to particular embodiments and with reference to certain drawings but the invention is not limited thereto but only by the claims. In particular, the present invention will be described with respect to charge trapping devices having a dielectric charge trapping layer, but the invention also comprises other types of charge trapping devices, such as nano-crystal memory devices.

The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first and second and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Throughout this description, the terms "column" and "row" are used to describe sets of array elements which are linked together. The linking can be in the form of a Cartesian array of rows and columns however the present invention is not limited thereto. As will be understood by those skilled in the art, columns and rows can be interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, reference is made to logically organized rows and columns. By this is meant that sets of memory elements are linked together in a topologically linear intersecting manner however, that the physical or topographical arrangement need not be so. For example, the rows may be circles and the columns radii of these circles and the circles and radii are described in this invention as "logically organized" rows and columns. Also, specific names of the various lines, e.g. bitline or wordline are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

FIG. 1 shows a simplified picture of a flash transistor 10 based on a dielectric charge trapping layer 11. Such flash transistor 10 comprises a substrate, a bottom dielectric layer, a dielectric charge trapping layer, a top dielectric layer and a top electrode. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. In the following reference will be made to silicon processing as silicon semiconductors are commonly used, but the skilled person will appreciate that the present invention may be implemented based on other semiconductor material systems and that the skilled person can select suitable materials as equivalents of the dielectric and conductive materials described below.

For simplicity, and as an example only, not intending to limit the invention thereto, such a memory cell comprising a flash transistor with a dielectric charge trapping layer will be referred to as a SONOS device in the remainder of this invention disclosure. SONOS is an electrically-erasable, programmable, non-volatile memory structure. It comprises a stack comprising a silicon substrate 12, a bottom dielectric which is a bottom oxide layer 13, a nitride layer 11 forming the dielectric charge trapping layer, a top dielectric which is a top oxide layer 14 and a silicon top electrode 15. Generally, the top electrode is made from polysilicon, however, in alternative processes this top electrode for a same kind of device can for example also be made of metal.

Figure 1A:
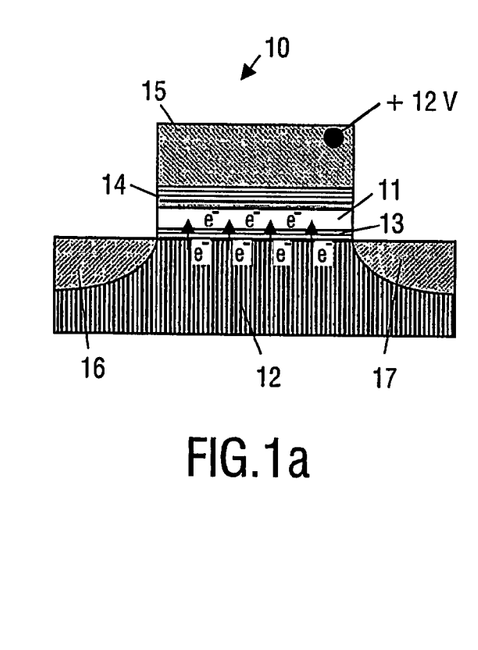
Figure 2A:
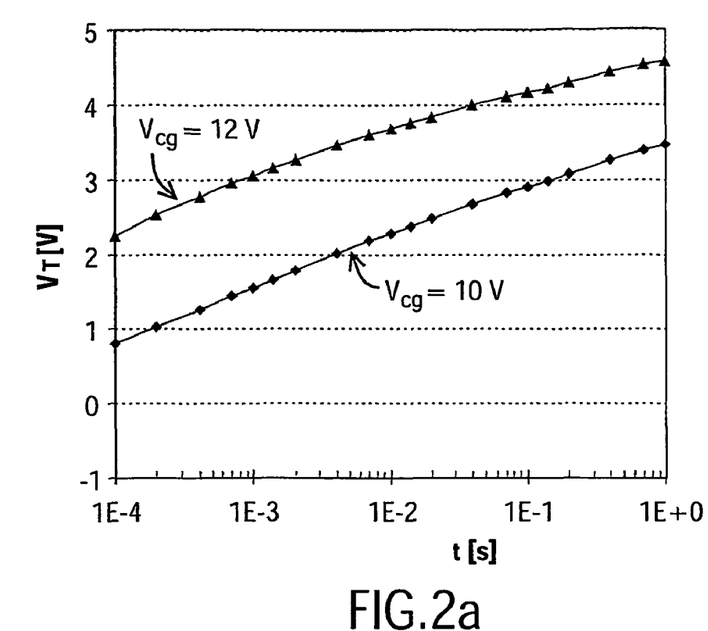
FIG. 2a) is a graph of measured program curves for a sample of a 256 bit prototype SONOS array.

As the bottom oxide layer 13 is much thinner (typically 2 to 3 nm) than the top oxide layer 14 (typically 5 to 10 nm), electrons and holes can tunnel much easier through the bottom oxide layer 13 (by direct tunneling) than through the top oxide layer 14 (by Fowler-Nordheim tunneling). Therefore, a sufficiently high positive voltage, depending on the layer thicknesses in the ONO stack, typically between 9 Volts and 14 Volts, applied to the top electrode 15 or control gate (CG) leads to an electron tunneling current from the substrate 12 towards the dielectric charge trapping layer or nitride layer 11, where the electrons are trapped, as shown in FIG. 1a. The trapped electrons, which cannot leave the nitride layer 11 through the top oxide layer 14 since this is too thick, give rise to an increased threshold voltage $V_T$ which indicates that the device 10 is programmed. For a given voltage level applied to the top electrode 15, it can be said that the longer the programming time, the more electrons are trapped in the dielectric charge trapping layer 11 and the higher is the threshold voltage $V_T$. On the other hand, for a given programming time, the higher the voltage level applied to the top electrode 15, the more electrons are trapped in the dielectric charge trapping layer 11, and the higher is the threshold voltage $V_T$. This is illustrated in the experimental programming curves in FIG. 2a, which were measured on prototype cells. These prototype cells have dimensions of W/L=0.18 μm/0.23 μm. The ONO stack has layer thicknesses of 2.2 nm/6 nm/8 nm. All terminals, except for the control gate, were grounded during programming. It is to be noted that the required control gate voltage is significantly below the ~15 V which is usually needed for Fowler-Nordheim programming of state-of-the-art FG cells: for flash memory cells having a dielectric charge trapping layer, a programming voltage of, depending on the layer thicknesses of the ONO stack, typically 10 to 12V applied to the top electrode is sufficient.

Figure 1B:
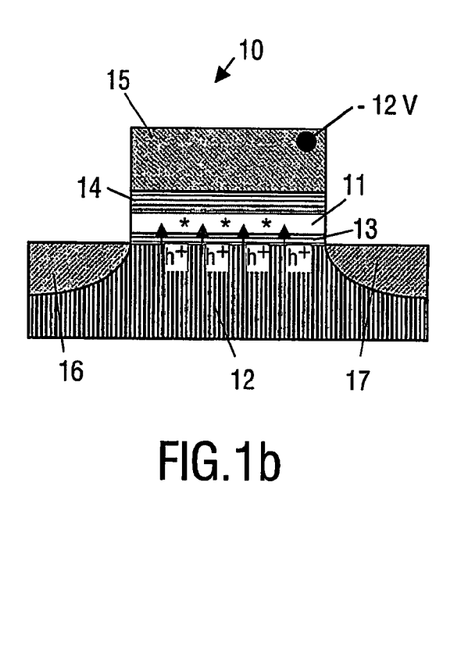
Figure 2B:
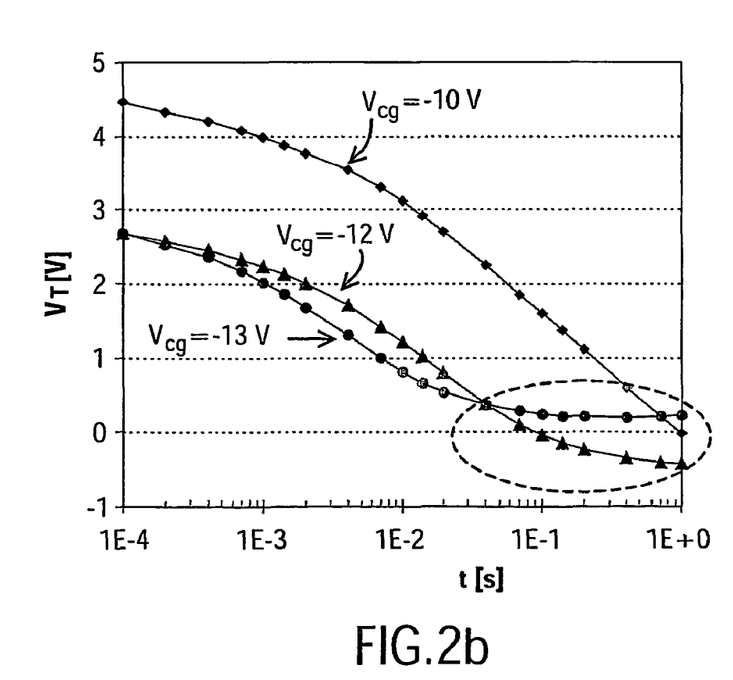
FIG. 2b) is a graph of measured erase curves for the same device. The self-limiting effect at long erase times and/or high erase voltages which is indicated by the dashed line, is to be noted.

To erase a programmed device 10, a suitable negative voltage, for example between −8 and −14 Volts, depending on the composition of the ONO stack, typically −12V, is applied to the top electrode 15 (FIG. 1b). Now, holes from the substrate 12 tunnel through the bottom oxide layer 13 and are finally trapped in the nitride layer 11. If this is done after electrons have been trapped in the nitride layer 11, then the newly trapped holes recombine there with previously trapped electrons. This causes the memory cell 10 to be erased, by decreasing the amount of negative charge in the nitride layer 11, and consequently the threshold voltage $V_T$ decreases again, as illustrated in the experimental erase curves plotted in FIG. 2b. The same prototype cells as mentioned above were used. It can be seen that, for a given voltage level applied to the top electrode 15, it can be said that the longer the erase time, the more holes are trapped in the nitride layer 11, the more electrons trapped in the nitride layer 11 recombine with the holes and the lower is the threshold voltage $V_T$. On the other hand, for a given programming time, the higher the absolute value of the erase voltage level applied to the top electrode 15, the more holes are drawn into the nitride layer 11, the more electrons recombine with these holes, and the lower is the threshold voltage $V_T$.

Figure 1C:
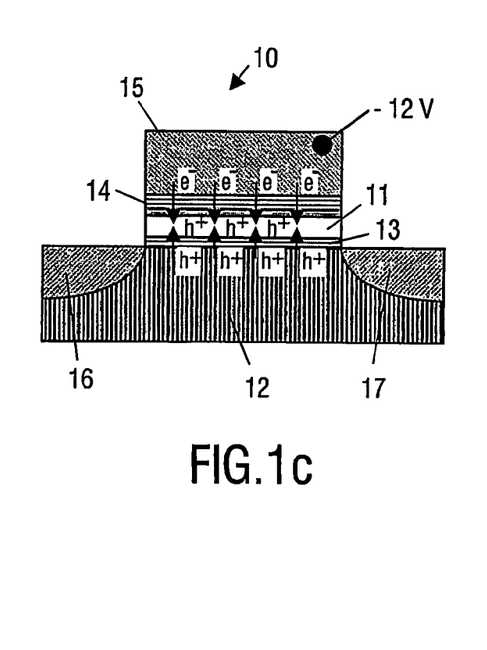

If the erase process is continued for a long time, the nitride layer 11 becomes more and more positively charged, as there are not enough electrons left for the holes trapped in the nitride layer 11 during the erase process to recombine with. This decreases the electric field in the bottom oxide 13, but at the same time increases the electric field in the top oxide 14. Finally, the electric field in the top oxide 14 becomes large enough to inject ELECTRONS from the top electrode 15 through the top oxide 14 into the nitride layer 11 (by Fowler-Nordheim tunneling, a process whereby electrons tunnel through a barrier in the presence of a high electric field), and in the end, a dynamic equilibrium arises in which the electron current from the CG 15 cancels the hole current from the substrate 12, as is schematically depicted in FIG. 1c. The analogous process of this in a 'normal' floating gate device would be an electron flow through the interpoly dielectric (IPD) from the control gate (CG) to the floating gate (FG). This, however, can never occur: due to the geometry of a floating gate device, most of the voltage drop is over the tunnel oxide, which is up to a factor two thinner than the IPD. So, long before a current would be able to flow through the IPD, the tunnel oxide would have broken down. Therefore, the situation as depicted in FIG. 1c can only occur in devices having a dielectric charge trapping layer, and not in floating gate devices.

At first sight, this self-limiting effect (which results in the 'saturation' of the erase curves in FIG. 2b) might seem to be a valuable tool to control the threshold voltage $V_T$ after erasure, but it appears now that the associated extended hole injection through the bottom oxide 13 and/or the injection of electrons through the top oxide 14 severely degrades the device characteristics.

Figure 3A:
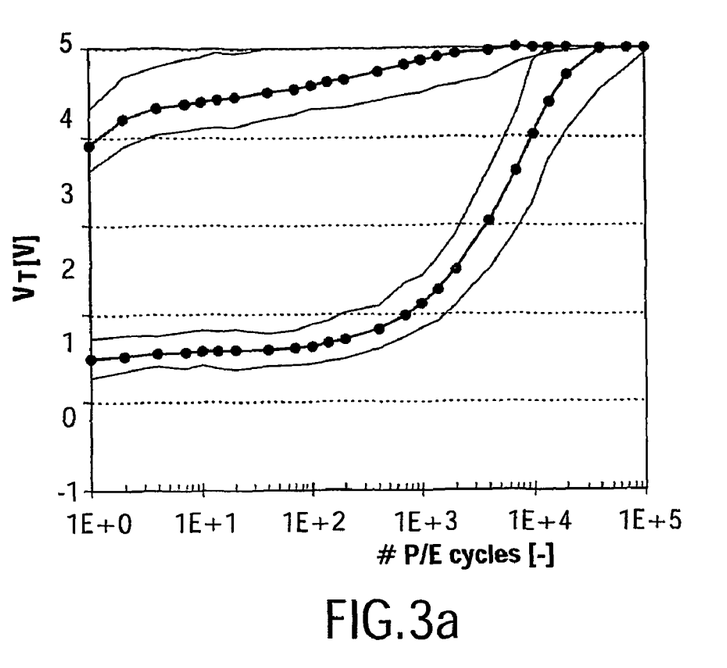
FIG. 3a) is a graph of measured endurance curves for a sample of a 256 bit prototype SONOS array. The lines with markers indicate the average threshold voltage $V_T$ in the array, the other lines indicate the minimum and maximum threshold voltage $V_T$ in the array. Clearly, after 1000 cycles, the window closure is dramatic. The measurement compliance, i.e. the maximum threshold voltage $V_T$ which can be measured, was set to 5 V. This means that if the threshold voltage is for example 8 Volts, it is represented as 5 Volts.
Figure 3B:
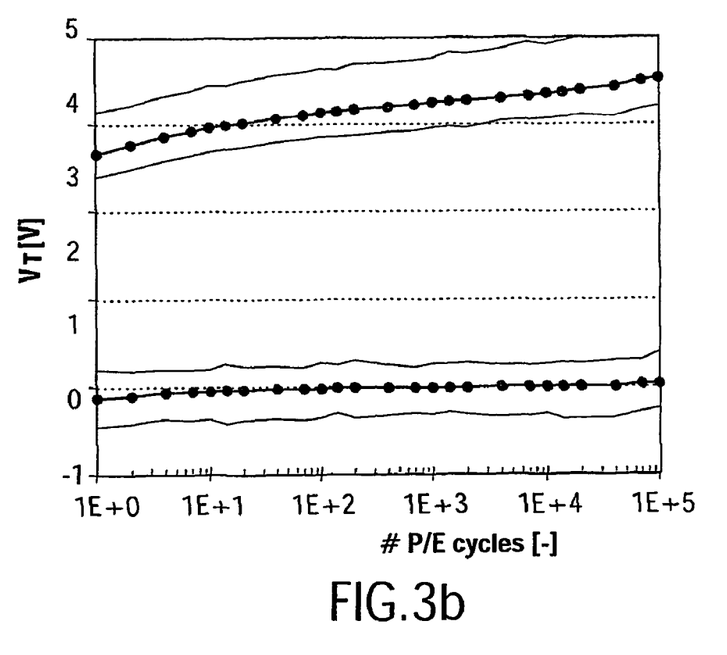
FIG. 3b) is a graph of measured endurance curves for an identical device, but now with other erase conditions. This leads to a much better endurance. At optimized erase conditions, it has been possible to demonstrate endurance levels of tens of millions of program/erase cycles.

This is clearly shown in FIGS. 3a and 3b, which show program/erase endurance curves of two identical SONOS arrays, only with different erase conditions. FIGS. 3a and 3b have been measured on arrays with transistors with W/L=0.18 μm/0.23 μm as for the prototype cells used for the measurements of FIG. 2. However, the ONO stack was different: layer thicknesses were 2.2 nm/6 nm/5 nm. Due to the thinner top oxide layer, erase degradation becomes better visible. In FIG. 3a, the erase conditions were taken such that self-limiting occurred (i.e. long erase times −100 ms, which for an applied CG voltage of −12V results in self-limiting as can be seen from FIG. 2b), whereas in FIG. 3b the erasure conditions were set in such a way that the self-limiting regime was not entered (i.e. shorter erase times −50 ms, which for an applied CG voltage of −9V does not result in self-limiting). The difference in $V_T$ window closure is obvious. The $V_T$ window closure as in FIG. 3a makes it impossible to distinguish between programmed and erased states after a large number of program/erase cycles, e.g. as from about 10000 program/erase cycles. It was verified experimentally that other programming conditions, i.e. other programming voltages and other programming times, did not lead to an enhanced degradation, even when very high CG voltages were used for very long times.

But even when using proper erasure conditions, i.e. with erase times such that self-limiting is avoided, erase induced degradation is a serious problem, as there are many cells that are already in the erased state at the start of a block erase. These cells will be erased again and again, and finally, the cumulated nitride charge will become positive enough to cause the destructive self-limiting effect in each subsequent erase action.

Figure 10:
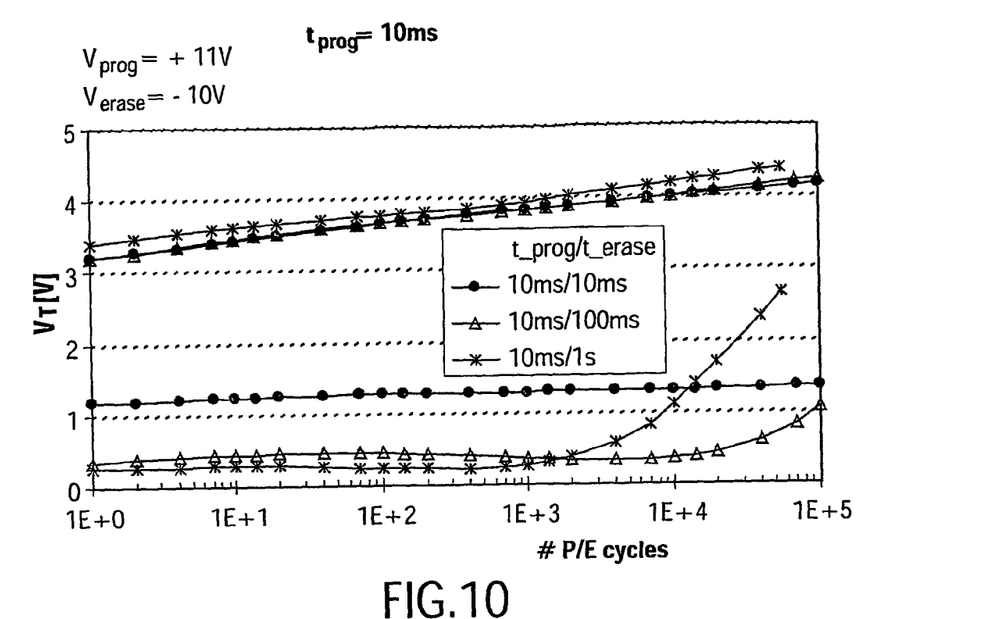
FIG. 10 is a graph showing measurement results of endurance curves for an array of SONOS memory cells illustrating the occurrence of erase degradation in SONOS memory elements.
Figure 11:
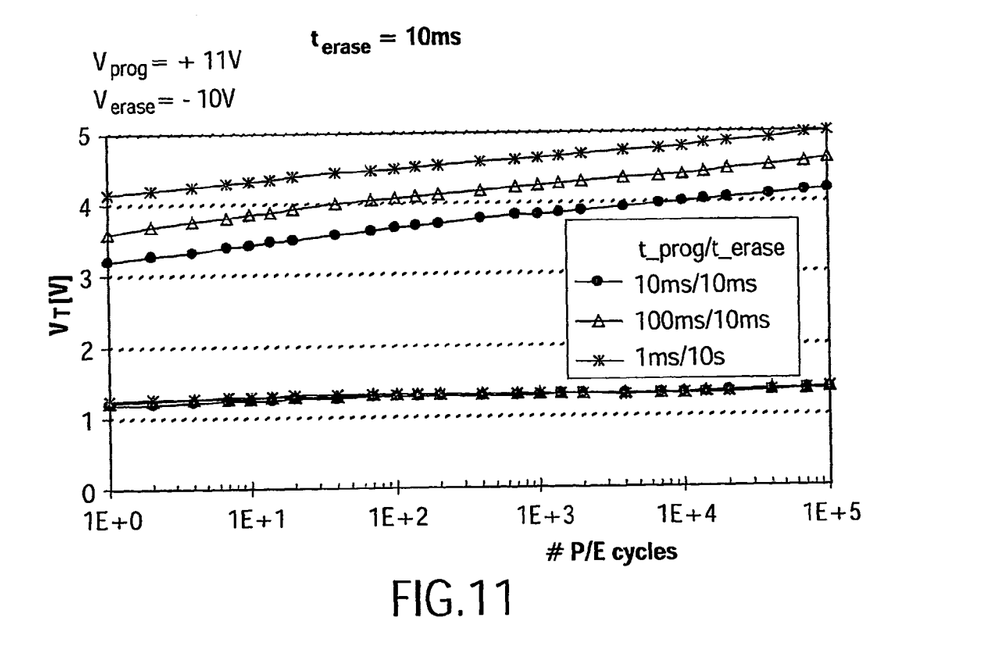
FIG. 11 is a graph showing measurement results of endurance curves for an array of SONOS memory cells illustrating the non-occurrence of program degradation in SONOS memory elements.

FIG. 10 shows that erase degradation in SONOS devices occurs, while FIG. 11 shows that program degradation does not occur.

FIG. 10 is a graph showing measurements on 256-bit SONOS arrays which have been program/erase cycled $10^5$ times with a programming voltage $V_{prog}=11$ V and an erase voltage $V_{erase}=-10$ V. The graphs show average values over the 256 bits in an array. The programming time has been kept constant at 10 ms, and the erase time has been taken 10 ms, 100 ms and 1 s respectively. It can be seen from FIG. 10 that the longer the erase time, the worse the endurance curve.

Main differences between memory devices with a dielectric charge trapping layer and floating gate devices as can be noticed from FIG. 10 are the following:

a longer erase time does not lead to a larger $V_T$ window, and despite the substantially unchanged $V_T$ window, the endurance becomes worse with longer erase times.

Therefore, it is important to provide a careful and secure erase method for devices having a dielectric charge trapping layer, such as SONOS devices for example.

FIG. 11 shows that program degradation does not occur in SONOS devices. Measurements have been performed on 256-bit SONOS arrays which have been program/erase cycled $10^5$ times with a programming voltage $V_{prog}=11$ V and an erase voltage $V_{erase}=-10$ V. The graphs show average values over the 256 bits in an array. The erase time has been kept constant at 10 ms, and the programming time has been taken 10 ms, 100 ms and 1 s respectively. The graphs obtained look very much like the graphs which would be obtained with FG memories: the $V_T$ window becomes larger due to longer programming times, but the endurance stays substantially the same.

Therefore, according to an aspect of the present invention, erase induced degradation due to repeated erasing of memory cells is reduced. Essentially, erase induced degradation is solved by preceding every block erase (usually called flash erase) by a block program. In this way, a cell can never experience two consecutive erase cycles without an intermediate programming cycle.

Figure 4:
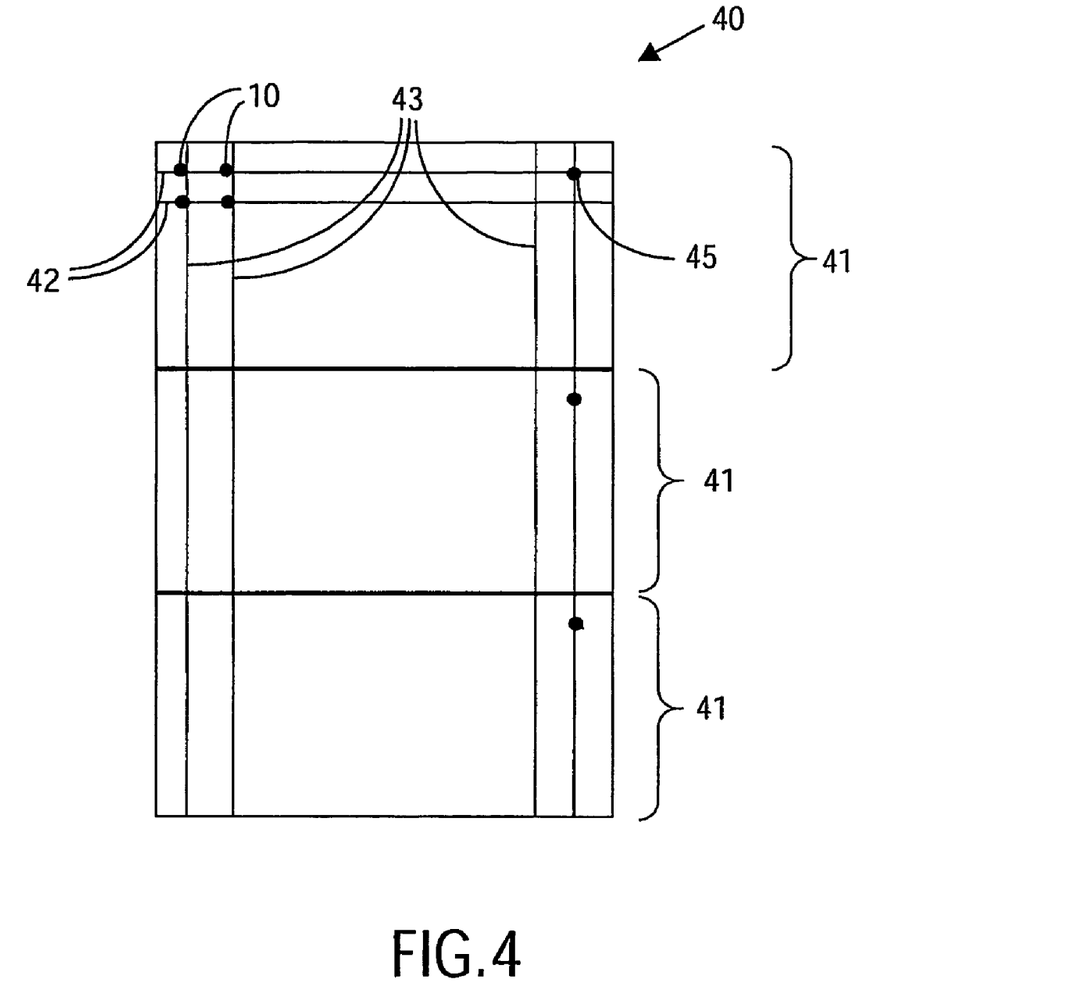
FIG. 4 is a schematic illustration of a flash memory array comprising charge trapping memory devices having a dielectric charge trapping layer in accordance with an embodiment of the present invention.

FIG. 4 illustrates a memory array 40, including a plurality of sectors or blocks 41. Each sector 41 includes a plurality of non-volatile memory devices 10 with a dielectric charge trapping layer, which are logically arranged in columns and rows and are suitably located at intersections of word lines 42 and bit lines 43. Array 40 is generally configured such that each sector 41 is isolated from other sectors 41 and such that each sector 41 may be erased at one time. Such erasure is also called a "flash erase" or "block erase". Array 40 is generally further configured such that cells 10 are programmed on a per bit (one cell 10) or a per page (one or more cells 10 along word line 42) basis. Although a page could include any number of bits along a word line, in accordance with an exemplary embodiment of the present invention, a page typically includes up to about 512 bits. In other embodiments, the number of bits may be much larger, for example 4096.

The number of word lines 42 and bit lines 43 in the array 40 may vary from application to application. Typically they may be equal to, for a 16 Mbit memory, 4096 bit lines (=number of bits per page), 256 word lines per sector and 16 sectors. Other combinations are, however, also possible. Furthermore, sectors do not need to have the same number of word lines. The number of bit lines is the same from sector to sector.

As mentioned above, FIG. 1 illustrates a typical non-volatile memory cell 10 with a charge trapping layer, more specifically of the SONOS type. Memory cell 10 generally includes a first and a second electrode region, e.g. a source region 16 and a drain region 17, a stack comprising a silicon substrate 12, a bottom oxide layer 13, a nitride layer 11 forming the dielectric charge trapping layer, a top oxide layer 14 and a silicon top electrode 15.

All top electrodes 15 of memory devices 10 within a sector 41 along a word line 42 are electrically coupled together. All drains 17 of memory cells 10 within a sector 41 along a bit line 43 are electrically coupled together. In addition, all source regions 16 of all memory cells 10 within a sector 41 are tied together.

In operation, useful information is stored in memory cells 10 of array 40 by setting cells 10 within the array 40 to a charged state, corresponding to a first binary value, e.g. 0, or by leaving them to a discharged state, corresponding to a second binary value, e.g. 1. A memory cell 10 is charged by injecting electrons into charge trapping nitride layer 11.

Erasing a memory before programming or writing new values in it is what is typically done. Such erasing is a block erase process, i.e. all memory cells 10 of a sector 41 are erased at once. In this way, however, generally there can be memory cells 10 which are erased hundreds of times without an intermediate programming action, which inevitably leads to degradation of those cells, as mentioned above. To reduce and preferably prevent this, according to an embodiment of the present invention a block program (i.e. programming of all cells 10 of a sector 41 in parallel) is performed before each flash erase action. When this is done, an erased cell can never be erased a second time, as all cells are programmed before erasure.

Figure 5:
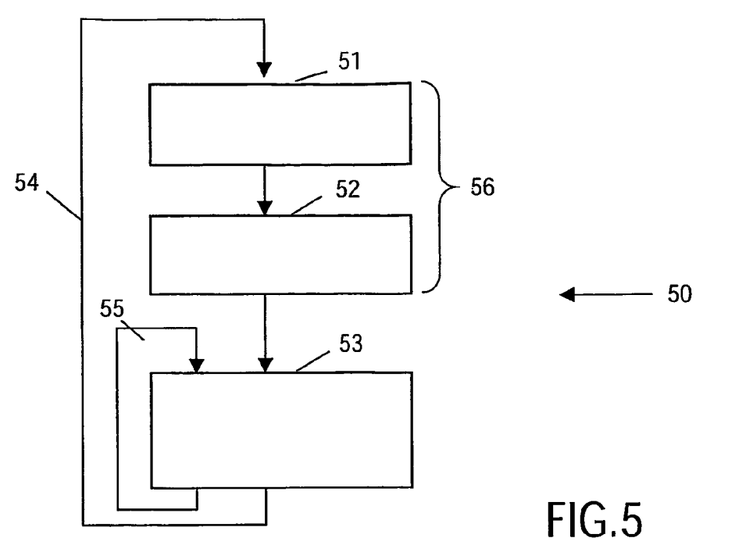
FIG. 5 is a schematic illustration of a process for programming information into the array of FIG. 4.

In accordance with one aspect of the present invention, information is programmed into each sector 41 of array 40 according to a process 50 which is illustrated in FIG. 5. Process 50 generally includes a pre-condition step 51, an erase step 52, and a program step 53. Although process 50 is illustrated in FIG. 5 with only pre-condition, erase and program step, process 50 may suitably include any desired number of program, pre-condition and erase steps as indicated by the loop 54 shown in FIG. 5. Furthermore, the program step 53 can be repeated before a next sector erase action takes place, as indicated by loop 55. Even an already programmed cell can be reprogrammed.

As indicated in FIG. 5, process 50 begins with a pre-condition step 51. Pre-condition step 51 is configured to mitigate effects of successive discharge operations which discharge an already discharged memory cell 10. In particular, in accordance with an embodiment of the present invention, pre-condition step 51 generally includes a relatively short block program or charge step of substantially all cells in a sector 41 of the array 40, short being compared to the length of the erase step, prior to block erase step 52 to mitigate stress due to discharging of already discharged memory cells. The block program step 51 together with the block erase step 52 form a sector erase action 56.

In accordance with an embodiment of the present invention, all memory cells 10 within the sector 41 are submitted to pre-conditioning charge step 51 at substantially the same time for substantially the same amount of time.

During pre-condition step 51, memory cells 10 preferably are completely charged, as this only takes 1 to 10 ms (the standard programming time), which is about ten times faster than the subsequent erase action (typically between 10 and 100 ms). Because the threshold voltage $V_T$ of already programmed cells barely changes with a doubling of the time, as shown in FIG. 2 (logarithmic time scale), all cells have about the same threshold voltage $V_T$ after the pre-conditioning step or block program step 51.

Furthermore, power consumption of this preconditioning program operation 51 before erasing 52 is minimal: it is programming by tunneling of charge carriers, and this does not require a lot of energy.

After the pre-condition step 51, an erase step 52 takes place. Erase step 52 is a block erase step, i.e. during erase step 52, all memory cells 10 within a sector 41 are erased, thus setting all memory cells 10 within sector 51 to their discharged state. Erase step 52 may be configured to erase all memory cells 10 within sector 41 at substantially the same time.

As already mentioned above, discharging an already discharged memory cell 10 may deteriorate this cell 10. However, by performing the pre-condition step 51, which according to the present invention is a charging step, before the erase step 52, none of the memory cells 10 of sector 41 are in a discharged state before the block erase step 52 takes place. Therefore, during the erase step 52 no discharging of an already previously discharged memory cell 10 takes place.

The block erase step 52 is followed by a program step 53. A desired binary pattern, representing information to be stored, is programmed or written to memory cells 10 of a sector 41 during step 53, by charging specific memory cells 10 within sector 41. This may be done on a cell-by-cell or on a page-by-page basis. Thus, memory cells 10 that are to remain at the uncharged state, i.e. having the second binary value, e.g. 1, are not affected during the write or program process 53. When new information is to be programmed into cells 10, these cells 10 are submitted to the program step 53 and are brought in the charged state, i.e. having the first binary value, e.g. 0.

Useful information is stored within sector 41 during program step 53 by charging a portion of the memory cells 10 within that sector 41, depending on the information to be stored. Cells 10 that are to be charged during program step 53 are selected by suitably selecting a word line 42 and selecting a bit line 43. The drive electronics used for this may be the same as the drive electronics which are typically used to program and erase floating gate flash cells with FN tunneling. It is important for FN programming that each SONOS cell in the array comprises its own select transistor in series with the cell (a so-called 2-transistor common ground NOR array configuration may be used; alternatively for example 1-transistor virtual ground may also be used).

Of course, when the above solution according to the present invention is applied, there will always be memory cells 10 which are programmed twice before erasure-memory cells 10 which are programmed during program step 53, which are further charged during a subsequent pre-condition step 51—but this does not pose particular (reliability) problems since, as has been found by the inventor of the present invention, 'program induced degradation' does not exist for charge trapping memory devices having a dielectric charge trapping layer: programming during a long time, repeatedly or with large control gate voltages does not lead to degradation (contrary to erasing), as illustrated in FIG. 11. As the programming action is generally much faster than the erase action (programming typically takes 1 to 10 ms, erase is typically 10 to 100 ms, so one order of magnitude longer), the proposed scheme of carrying out a pre-condition charging step 51 before an erase step 52 will not significantly slow down the flash erase process.

A positive side-effect of the erasure method preceded by a flash programming step according to an aspect of the present invention is further that all memory cells 10 in the array 40 have undergone the same number of program/erase cycles, so the level of degradation due to program/erase endurance is the same for all the memory cells 10 of the array 40.

Figure 6:
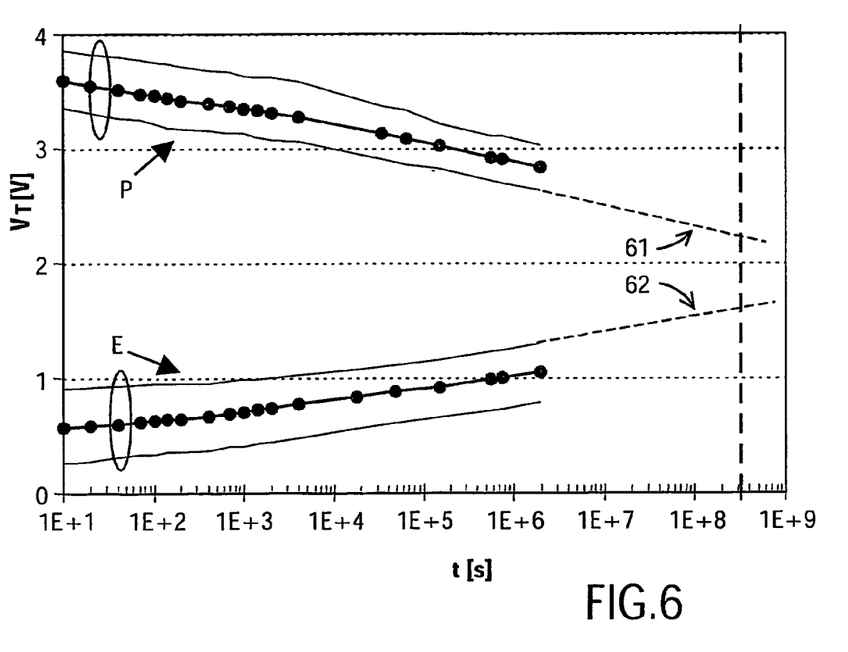
FIG. 6 is a graph illustrating extrapolated data retention test for two small SONOS arrays (256 bits) as function of the time t. Prior to this test, both arrays were cycled $10^5$ times. The graph shows the minimum, average and maximum threshold voltages $V_T$ of the arrays. It is to be noted that the threshold distribution does not widen during ageing, or in other words, that no extrinsic 'leaky' bits are observed. The vertical dashed line corresponds to a time t of 10 years.

FIG. 6 shows the time evolution of the threshold voltages $V_T$ in two small (256 bits) arrays, one in the programmed state P and one in the erased state E. Both arrays had undergone a serious program/erase cycling of $10^5$ cycles prior to the retention test of which the results are illustrated in FIG. 6. Obviously, the threshold voltage $V_T$ of the devices is not as stable as in floating gate arrays, although extrapolation 61, 62 of the graph learns that even after 10 years (a standard retention spec) the $V_T$ window is still large enough to distinguish, e.g. at a read voltage between 1.7 and 2.2 V, for example $V_{cg}$=2 V, between programmed memory cells 10, having a data content with a first binary value, e.g. '0', and erased memory cells 10, having a data content with a second binary value, e.g. '1'.

Reading the data content of a non-volatile memory device 10 having a dielectric charge trapping layer 11 is performed by placing an operating voltage e.g. between 0.1 V and 1 V, e.g. 0.5 V, across its source 16 and drain 17 and on its control gate 15, and then detecting the level of the current flowing between the source 16 and the drain 17. The level of current is dependent on the difference between the applied control gate voltage and the threshold level $V_T$ of the memory device 10, which in turn is determined by the amount of charge stored in the dielectric charge trapping layer 11.

Conventionally, a breakpoint current level is established at a fixed control gate voltage on the word line to be read so as to partition the threshold window into two regions. The read out source/drain current is compared with the breakpoint current level; if it is lower than the breakpoint current level, the memory cell 10 is determined to be in a programmed state, having a first binary value, e.g. '0', and if it is higher than the current threshold level, the memory cell 10 is determined to be in an erased state, having a second binary value, e.g. '1'.

However, a serious problem is that the read current of erased memory cells 10 will decrease in time, because their threshold voltage $V_T$ increases, as can be seen from FIG. 6. This means that read errors could occur after some years. Moreover, the read current of erased memory cells 10 depends on the endurance cycling history. Therefore, reading with a fixed current threshold between the first binary value, e.g. '0', and the second binary value, e.g. '1' (as is usually done with FG arrays) is not ideal for charge trapping memories having a dielectric charge trapping layer.

Therefore, according to another aspect of the present invention, the problem of non-constant read-current may be alleviated. The issue of the non-constant read-current can be solved by using an erased charge trapping device having a dielectric charge trapping layer as a current reference cell in the sense amplifiers. If this reference cell is also programmed and erased each time that a flash erase is performed on the memory cells 10 of the sector 41, i.e. with the flash erase of the memory cells 10 of the sector 41, shortly before or shortly thereafter, its threshold voltage $V_T$ and hence the read current criterion tracks the ageing of the memory cells 10 in the sector 41. This approach is possible thanks to the fact that the memory cells 10 in a charge trapping memory array 40 behave deterministic, i.e., they all show the same behavior.

To appreciate this idea, it is important to realize that the data retention characteristics in FIG. 6, which were recorded after a rather severe endurance of $10^5$ cycles, do not show any extrinsic cells: all the cells 10 in the memory array 40 behave in the same 'intrinsic' way. This is completely different from the situation in FG memories, where, especially after extended program/erase cycling, a certain part of the cells shows a much (orders of magnitude) faster data loss than the other cells, which is due to a mechanism generally referred to as 'stress induced leakage current' (SILC).

The fact that, in a charge trapping memory cell having a dielectric charge trapping layer, the charge loss occurs in a deterministic instead of stochastic way, gives the possibility to adapt the read conditions (e.g. read current and/or gate voltage) during the life time of the memory cells 10.

An aspect of the present invention is to use one or more suitably biased erased charge trapping devices 45 as a reference memory cell in the sense amplifiers. If this reference memory cell 45 is programmed and erased together with the entire array 40 each time when a pre-conditioning flash program step 51 followed by an erase step 52 is done according to the other aspect of the present invention, its threshold voltage $V_T$ 'automatically' tracks the ageing of the memory cells 10 in the array 40, both in terms of charge leakage (data retention) and in terms of program/erase cycling induced degradation.

Moreover, the use of a 'real' memory cell as a reference cell 45 also reduces and preferably prevents read errors due to temperature changes or supply voltage variations, since the reference cell 45 in the sense amplifiers reacts in exactly the same way as the memory cells 10 in the array 40.

Figure 7:
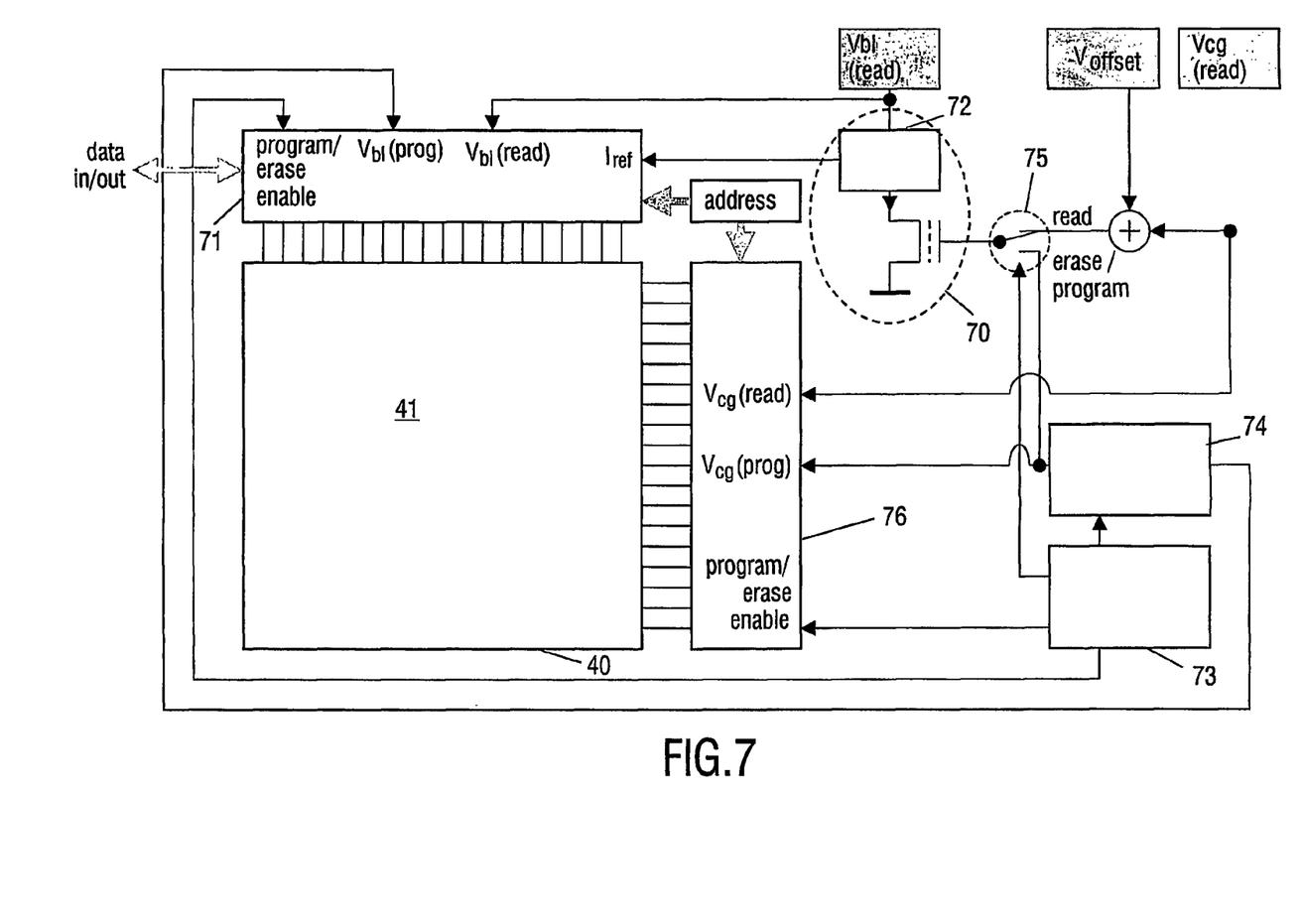
FIG. 7 is a schematic overview of adaptive reference circuitry in which the read current is adapted to the ageing of the memory cells in accordance with an embodiment of the present invention. Also programming and erase elements are shown.

According to one embodiment, as illustrated in FIG. 7, the read current of the memory cells 10 is adapted to the ageing of these cells. SONOS current reference cell 70 has the same dimensions as the cells in sector 41 of the array 40. The following read voltages are fixed: the bitline voltage $V_{bl}$ and the control gate voltage $V_{CG}$. During read-out, the (erased) SONOS current reference cell 70 is biased with these voltages $V_{bl}$ and $V_{CG}$, and via a current mirror 72 a corresponding reference read current is applied to the sense amplifiers in the bitline decoder block 71 as "trip point" or breakpoint current level, the distinguishing level between '0' and '1'. The gate voltage of the reference device 70, and thus the reference current $I_{ref}$, is lowered somewhat by means of a negative offset voltage $V_{offset}$ to take into account the $V_T$ spreading of the erased cells. If this would not be done, the erased cells which would not deliver enough current would be read out wrong. The offset voltage $V_{offset}$ should not be taken too negative, otherwise programmed cells can be read out as erased. A good value for the offset voltage $V_{offset}$ is half of the expected $V_T$ window after 10 years. The fixed control gate voltage VCG is applied to a word line driver and decoder 76.

Programming and erasing is controlled, just like reading, by a memory controller 73. The memory controller 73 imposes a block programming, whereby all cells in the array 40 and the current reference device 70 are programmed, before every block erase that is carried out. In order to obtain this, the gate of the reference device 70 is, by means of high-voltage switch 75, temporarily coupled to the same charge pump 74, as the gates of the memory devices in the array 41 during a short time period e.g. between 1 ms and 10 ms. A charge pump is a circuit which transforms a low voltage, e.g. a supply voltage of 1.2 V, to a high voltage of e.g. 12 V. Thereafter, all control gates are negatively biased, for example with about −11 V, also the control gate of the reference device 70, by means of the same high voltage switch 75, during a long time period e.g. between 10 ms and 100 ms. The block-erase is then ready, the controller 73 switches the HV switch 75 back to the "read position", as illustrated in FIG. 7. If thereafter cells in the array 40 are programmed, the controller 73 controls the HV switch 75 of the reference device 70 such that it stays in the "read position", so that the reference device 70 is not reprogrammed. Reprogramming of the reference device 70 may only take place at substantially the same time as, i.e. at the same moment, shortly before or shortly thereafter, a pre-conditioning step at the next block erase of the memory devices in the sector 41 of the array 40. Therefore, the reference device 70 is always in an erased or low $V_T$ situation during reading of the actual memory cells in the array 71.

In the circuit of FIG. 7, mention is only made of adjustment of the read current to ageing of the cells or the data stored therein. This has the disadvantage that the read current will decrease over time due to increasing $V_T$ of the erased cells. This will lead to a lower read speed.

Figure 8:
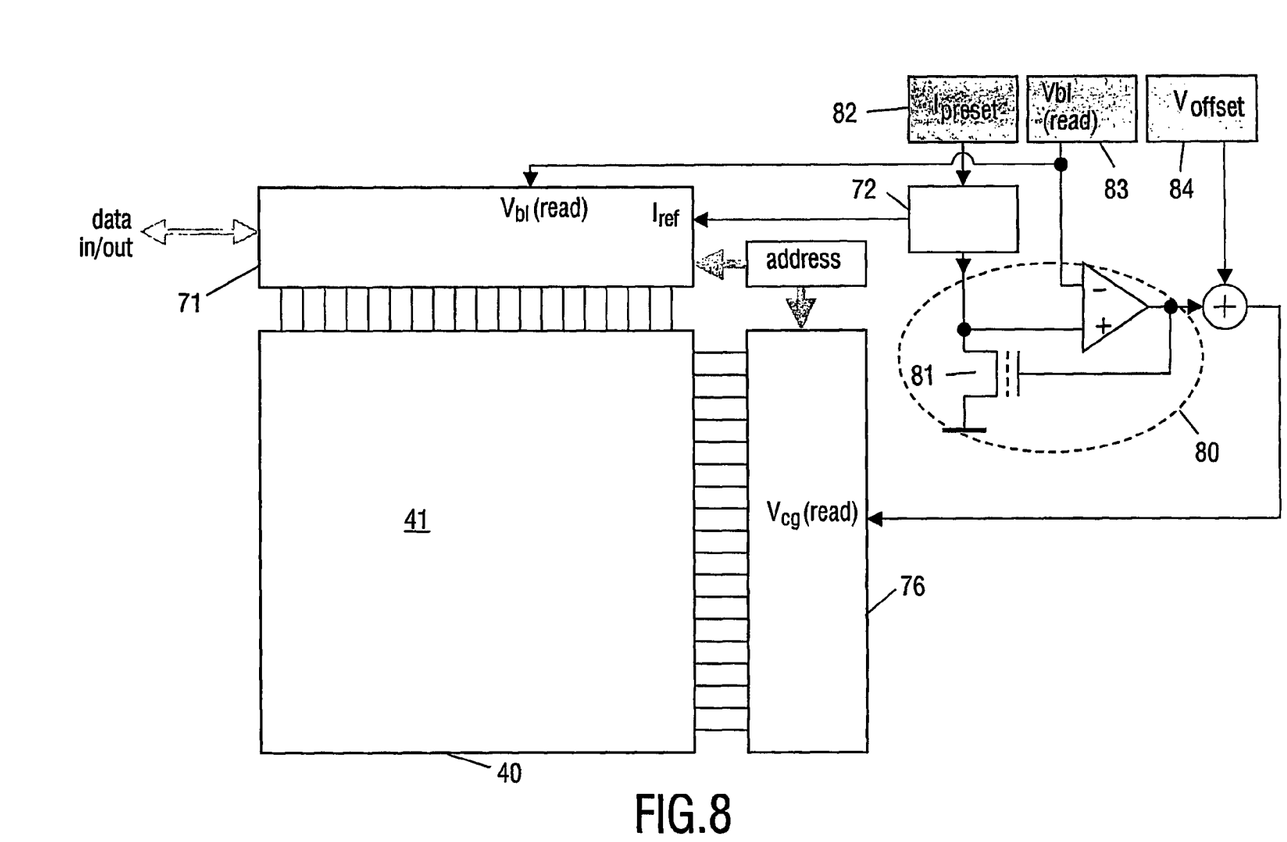
FIG. 8 is a schematic overview of adaptive reference circuitry in which the control gate voltage is adapted to the ageing of the memory cells in accordance with an embodiment of the present invention.

A solution for this is given in FIG. 8. In this circuit, not the read current but the control gate voltage $V_{CG}$ is adapted during the read operation. In FIG. 8, the writing part is not shown; it is comparable to or the same as that of FIG. 7. The voltage reference cell 80 now comprises an erased SONOS cell 81 with a feedback circuit which makes the control gate voltage of the voltage reference cell 80 to be the same as the one needed to get a pre-set read current $I_{pre-set}$ 82 at a given bitline voltage 83. Again an offset voltage $V_{offset}$ 84, this time a positive one, which equals preferably about half of the $V_T$ window after 10 years, is required to take into account the spreading on the threshold voltage levels $V_T$ of the memory cells in the sector 41 of array 40.

An advantageous combination of the circuits of FIG. 7 and FIG. 8 is also included within the scope of the present invention: if for a certain pre-set read out current value 82 the required control gate voltage 83 in FIG. 8 would become too high, for example higher than the supply voltage, then the current read value may be decreased by the memory controller 73.

According to a further aspect of the present invention, the use of an external reference cell 45, 70, 80 is not mandatory: also the cells inside the array 40 itself can be used as reference cells. This can be done by using a so-called DC-free coding scheme. DC-free coding is widely employed in storage. "DC-free" means that the coded sequence has no DC spectral component. It is a coding scheme in which the number of hardware first binary values, e.g. '1', and second binary values, e.g. '0' per wordline is always the same. A simple example of DC-free coding is, at the moment of writing or programming, to program each cell with a binary value and at the same time to program for each cell a neighbor with the inverse binary value. This means that half of the cells contains a '1', and the other half of the cells contains a '0'. This doubles the number of required cells for a given number of bits, but other, more efficient ways of DC-free programming are also possible.

Such DC-free coding scheme can thus only be used in combination with page write. By decoding, the real content of a wordline can be found. Coding and decoding can be performed very fast, so it will not limit the speed of the memory.

Figure 9:
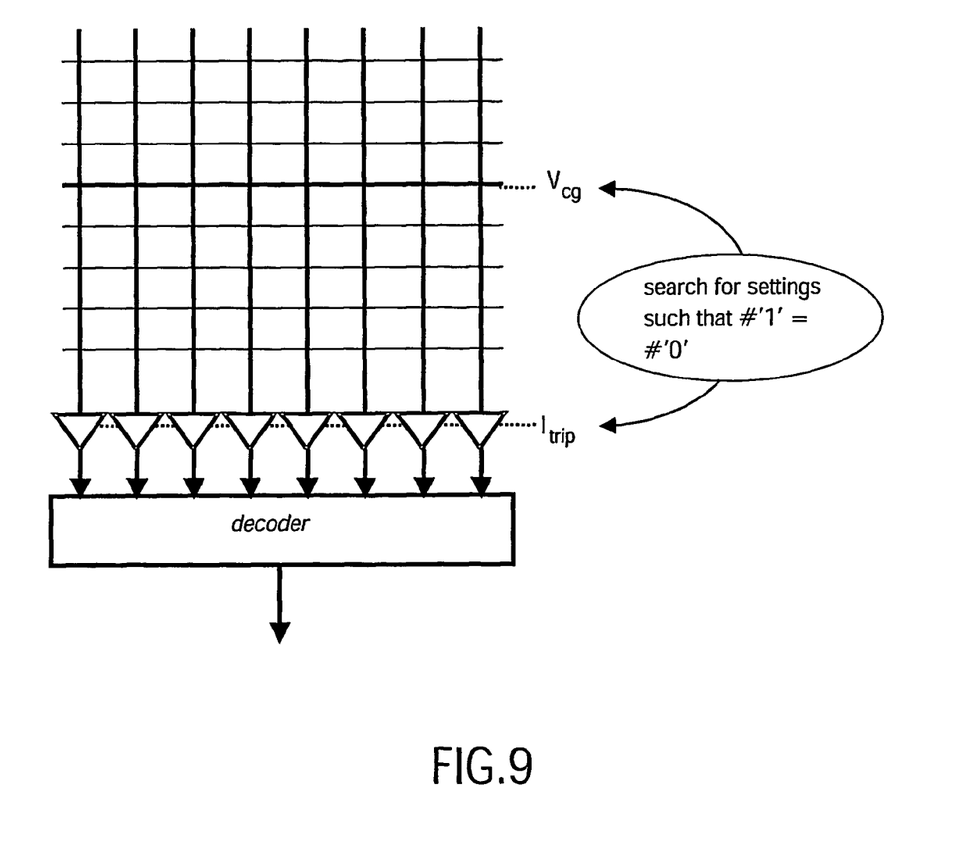
FIG. 9 is a schematic diagram illustrating the principles of DC-free coding to create a self-referencing SONOS array in accordance with an embodiment of the present invention. For clarity purposes, only the read principle is illustrated.

FIG. 9 schematically illustrates how the read-out is performed. If a read-out is carried out at a certain page (=word line 90), then the controller switches the trip-point or breakpoint current level $I_{trip}$ of the read current and/or the control gate voltage $V_{CG}$ until the moment that the number of '1' and '0' read is equal. Of course this decreases the read-out speed. Thereafter, the found '1' and '0' must be decoded to the real data, but this can happen very fast.

By, as in the other implementations, preceding every block-erase by a block-program as a pre-conditioning step, the erase-degradation problem is reduced.

It is to be understood that although preferred embodiments, specific constructions and configurations, as well as materials, have been discussed herein for devices according to the present invention, various changes or modifications in form and detail may be made without departing from the scope and spirit of this invention. For example, the detailed description has been given for SONOS devices, but those skilled in the art will appreciate that also other material stacks than SONOS can be used, which material stacks have a dielectric charge trapping layer, as for example silicon dioxide ($SiO_2$)/silicon nitride/aluminium oxide ($Al_2O_3$); or $SiO_2/Al_2O_3/SiO_2$.

The invention claimed is:

1. A method for operating an array of nonvolatile charge trapping memory devices, each device having a charge-trapping layer that traps charge by mitigating lateral charge transport therein, the method comprising:
   in response to a block erase request and before block erasing the array by discharging substantially all of the non-volatile charge trapping memory devices of the array,
   block programming the array by charging substantially all of the non-volatile charge trapping memory devices of the array, using the charge-trapping layer in each device to trap charge and mitigate lateral charge transport therein.

2. A method according to claim 1, furthermore comprising programming some of the non-volatile memory devices of the array after the erase operation based on data content to be stored in the non-volatile memory devices of the array.

3. A method according to claim 2, furthermore comprising reading the data content stored in a non-volatile memory device of the array using at least one further non-volatile memory device having a dielectric charge trapping layer as reference cell, the dielectric charge trapping layer having a crystalline structure that traps the charge at energy minima therein by mitigating lateral charge transport within the trapping layer, and programming and erasing the dielectric charge trapping layer for a block programming and block erase, respectively, of the non-volatile memory devices in the array.

4. A method according to claim 3, wherein
   the memory devices of the array together function as reference cells, and
   discharging substantially all of the non-volatile charge trapping memory devices of the array includes discharging substantially all of the non-volatile charge trapping memory devices in a discharging cycle, each subsequent discharging cycle being executed after an intervening charging cycle.

5. An electrical device comprising
   an array of non-volatile charge trapping memory devices, each device having a charge-trapping layer that traps charge by mitigating lateral charge transport therein, and
   a memory controller configured to
      control block programming the array by charging substantially all of the non-volatile charge trapping memory devices of the array, using the charge-trapping layer to trap charge at a trapping location within the charge-trapping layer via the mitigation of lateral charge transport away from the trapping location,
      control block erasing the array by discharging substantially all of the programmed non-volatile charge trapping memory devices of the array, and
      control the array of non-volatile charge trapping memory devices such that, in response to a block erase request and before block erasing of substantially all of the non-volatile memory devices of the array, substantially all of the non-volatile memory devices of the array are block programmed.

6. An electrical device according to claim 5, wherein the non-volatile memory device comprises a transistor having a channel and a control gate, a dielectric charge trapping layer being located between the channel and the control gate.

7. An electrical device according to claim 5, the array being provided with at least one non-volatile memory device for use as a reference cell in a sense amplifier.

8. An electrical device according to claim 7, the array comprising circuitry configured to program and erase the reference cell for a block-programming and block-erasing respectively of the non-volatile memory devices in the array.

9. An electrical device according to claim 7, wherein the at least one reference cell is separate from the array.

10. An electrical device according to claim 7, wherein the memory devices of the array are configured to function as reference cells.

11. An electrical device according to claim 7, comprising circuitry configured compare a read current from a non-volatile memory device in the array with a read current from the reference cell.

12. An electrical device according to claim 7, comprising circuitry configured to adapt a read current for reading the non-volatile memory devices in the array to the ageing of the reference cell.

13. An electrical device according to claim 7, comprising circuitry configured to adapt a required control gate voltage for reading the non-volatile memory devices in the array depending on the ageing of the reference cell.

14. An electrical device according to claim 5, wherein the array of non-volatile memory devices forms a non-volatile memory.

15. A method according to claim 1, wherein the non-volatile memory devices of the array each include a dielectric charge trapping layer and wherein block programming the array by charging substantially all of the non-volatile charge trapping memory devices of the array includes trapping charge in the dielectric charge trapping layers.

16. A method for use with programming an array of non-volatile charge trapping memory devices according to data content to be stored therein, each device having a charge-trapping layer that traps charge by mitigating lateral charge transport therein, the method comprising, prior to substantially every programming step:
   block programming, in response to a block erase request, substantially all of the non-volatile charge trapping memory devices of the array by charging substantially all of the non-volatile charge trapping memory devices, using the charge-trapping layer to trap charge therein by mitigating lateral charge transport within the charge-trapping layer; and
   after the block programming step, block erasing substantially all of the non-volatile charge trapping memory devices of the array by discharging substantially all of the non-volatile charge trapping memory devices.

17. The method of claim 16, further comprising programming a reference memory cell each time the block programming step is performed, and erasing the reference memory cell each time the block erasing step is performed, wherein the reference memory cell is a non-volatile charge trapping memory device.

18. The method of claim 17, further comprising comparing a read current from a selected non-volatile memory device in the array with a read current from the reference memory cell.

19. The method of claim 18, further comprising adapting the read current from the selected non-volatile memory device based on the read current from the reference memory cell.

20. The method of claim 17, wherein the reference memory cell has a programming and erasing history that matches the block programming and blocking erasing history of the array.

21. The method of claim 1, wherein the array is operated such that substantially none of the non-volatile charge trapping memory devices experiences two consecutive discharging cycles without experiencing an intermediate charging cycle.

* * * * *